United States Patent [19]

Peil et al.

[11] 3,768,061

[45] Oct. 23, 1973

[54] PUSH-BUTTON SWITCH ASSEMBLY WITH INTEGRAL RESISTANCE FOR ELECTRONIC TUNING

[75] Inventors: William Peil, North Syracuse; Peter R. Daino, Syracuse; Roland M. Marion, LaFayette; Brian J. Watkins, Liverpool, all of N.Y.

[73] Assignee: General Electric Company, Syracuse, N.Y.

[22] Filed: Oct. 22, 1971

[21] Appl. No.: 191,925

[52] U.S. Cl..................... 338/125, 338/128, 338/199

[51] Int. Cl............................................... H01c 5/00

[58] Field of Search.................... 338/116, 118, 122, 338/123, 128, 129, 137, 185, 125; 200/5 A, 5 B, 5 C, 5 D, 5 E, 5 R, 5 EA, 5 E, 5 F; 335/164, 78, 173; 325/452; 178/17 R; 340/365 R; 334/15

[56] References Cited

UNITED STATES PATENTS

| | | | |
|---|---|---|---|
| 3,535,671 | 10/1970 | Graf | 338/128 X |
| 3,522,542 | 8/1970 | Labude | 338/128 X |
| 3,109,906 | 11/1963 | Abendroth | 335/170 X |
| 3,489,867 | 1/1970 | Carlson | 338/118 X |
| 3,508,176 | 4/1970 | Labude et al. | 334/15 X |
| 3,559,118 | 1/1971 | Rummer et al. | 334/15 X |
| 3,601,703 | 8/1971 | Midgley | 338/137 X |

*Primary Examiner*—Richard B. Wilkinson
*Assistant Examiner*—U. Weldon
*Attorney*—Richard V. Lang et al.

[57] ABSTRACT

The present invention treats a push-button switch assembly with integral resistance which functions as a voltage divider having individually selectable and individually adjustable taps. The taps are selected by individual push-buttons. Individual adjusting knobs normally arranged behind each push-button provide for tap adjustment. The assembly is suitable for use in an electronically tuned television receiver wherein it provides both channel selection and fine tuning for a selected channel.

10 Claims, 3 Drawing Figures

PATENTED OCT 23 1973 3,768,061

PUSH-BUTTON SWITCH ASSEMBLY WITH INTEGRAL RESISTANCE FOR ELECTRONIC TUNING

The present invention is related to the invention of Messrs. Peil et al., the subject matter of patent application Ser. No. 191,924, filed concurrently herewith, and entitled "Push-Button Switch Assembly". The related application discloses a push-button switch assembly lacking an integral resistance.

BACKGROUND OF THE INVENTION:

1. Field of the Invention

The present invention relates to voltage dividers and more particularly to a voltage divider having a plurality of individually selectable taps which may be selected by operation of a push-button, and each of which may be adjusted. The invention is also related to switchign assemblies suitable for use in electrically tuned television and radio receivers.

2. Description of the Prior Art

At present, television receivers are most frequently tuned by a rotary switch which selects one of a plurality of separately tuned resonant circuits, each corresponding to a predetermined channel. In radio receivers, a rotating tap switch is not in common use, but one frequently finds a plurality of push-buttons, each one corresponding to a given station. In some cases, these push-buttons operate mechanical linkages for controlling the rotation of a variable capacitor. In other cases, the push-buttons insert separate tuned circuits tuned to the frequencies of individual stations. In many arrangements, radio frequency currents must be switched.

With the advent of electronic tuning, it has become evident that push-button station selection could be substantially simplified since the push-button need only produce an arbitrary voltage corresponding to a given station. Electronic tuning avoids both the need for switching resonant circuits and for switching radio frequency currents. With electronic tuning one need only switch prescribed resistances into low frequency or d.c. circuits.

A feature which has been a commonplace with push-button station selection has been the provision of means for adjusting the push-button to a prescribed station or for fine tuning of the station selected. When the push-button is provided in the radio receiver of an automobile, for instance, provision is made that the user may retune the individual button to select the stations that are within his locality or to retune one that is badly tuned. In respect to television receivers, it has been common for the television set owner to first select a station by depressing a button and then, if necessary, make a separate adjustment for fine tuning. This additional tunign feature has been thought to be necessary, but not as important in day to day usage as the selection feature.

Thus, in the common applications wherein push-button switching is used for station selection, some means have usually been provided for further adjustment. With the advent of electronic tuning, there has not been a ready-made device to perform both functions. Viewed electrically, the requirement is for a special kind of voltage divider with individually selectable taps combining the right mixture of resistance selection with resistance adjustment. Viewed from the point of view of user convenience, the resistance selection function should be most readily available while the resistance adjustment function should be available but less readily available.

SUMMARY OF THE INVENTION

Accordingly, it is an object of the present invention to provide an improved push-button frequency selector for use in an electronic tuning system.

It is another object of the percent invention to provide an improved push-button station selector providing fine tuning for use in an electronic tuning system.

It is a further object of the present invention to provide an improved push-button station selector having readily accessible station selection and less readily accessible fine tuning.

It is still another object of the invention to provide an improved variable resistance device having individually selectable taps and individually adjustable values.

These and other objects of the present invention are achieved in a combination comprising a stationary planar resistance element providing a spacially extending current path, and a plurality of tap switches arranged adjacent the resistance element and distributed along the current path. Each tap switch is provided with a moving contact displaceable in a plane parallel to the plane of the resistance for selecting a predetermined resistance value and displaceable in a direction perpendicular to the resistance plane for making and breaking contact with the resistance element. The combination also includes means for clearing previously closed contacts when the contacts of one tap switch are closed.

In accordance with a preferred embodiment of the present invention, a push-button is provided with means for coupling the push-button motion along a direction perpendicualr to the resistance plane to the moving contact member, but allowing motion between said members in a plane parallel to the resistance plane. A knob is provided with means for coupling knob rotation about an axis perpendicular to the resistance plane to the moving contact but allowing motion between these members along a direction perpendicular to the resistance plane.

In one practical application, the means for coupling push-button motion and knob rotation take the form of a moving contact assembly displaceable by the push-button in a direction perpendicualr to the resistance plane. A movable contact is supported upon the assembly and in engagement with the knob by means permitting rotation with respect to the assembly. The knobs are supported upon a first stationary member disposed in front of the moving contact assembly, each knob having a backward projection for rotating the contacts with respect to the assembly. Additional stationary means are provided for slidably supporting the moving contact assembly to prevent rotation about an axis perpendicualr to the resistance plane. The knobs are centrally perforated so as to permit mechanical coupling through the knobs between the push-buttons and the moving contact assemblies. Thus, the push-buttons may be mounted upon a removable cover. When the cover is in place access to the adjusting knobs is prevented and when the cover is removed access to the knobs is permitted

BRIEF DESCRIPTION OF THE DRAWING

The novel and distinctive features of the invention are set forth in the claims appended to the present application. The invention itself, however, together with further objects and advantages thereof may be best understood by reference to the following description and accompanying drawings in which:

DESCRIPTION OF THE PREFERRED EMBODIMENT

Figures 1, 2, 3:
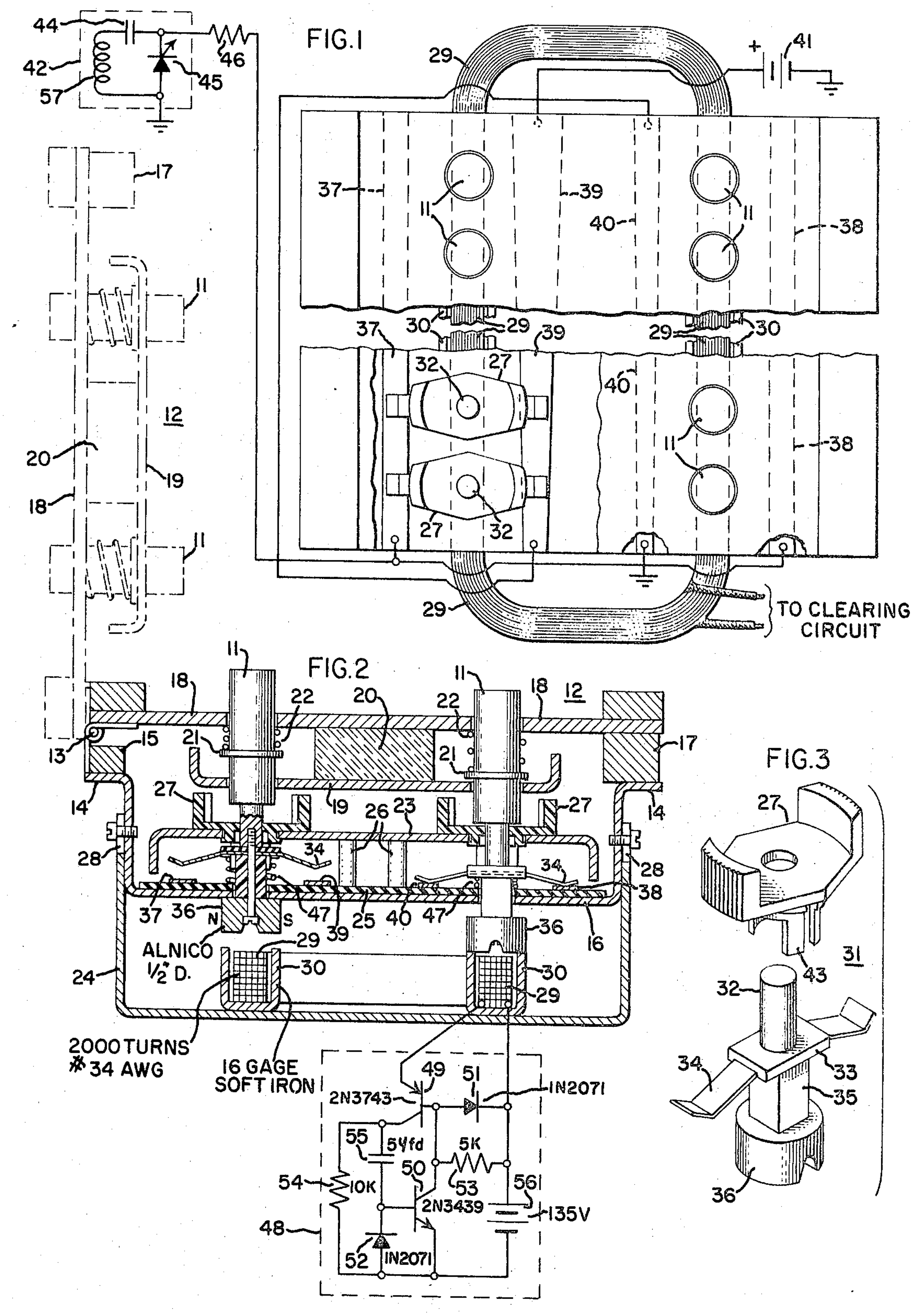
FIG. 1 is an illustration in plan view of a push-button assembly with integral resistance for electronically tuning a television receiver.
FIG. 2 is a side elevation of the push-button assembly illustrated in FIG. 1 showing the panel of the assembly in both open and closed positions together with the electrical circuit for clearing previously depressed buttons.
FIG. 3 is a perspective drawing illustrating the detailed construction of a tuning adjustment knob and a moving contact assembly 31 which take part in both the switching and the fine tuning operation at each push-button station.

Referring now to FIGS. 1 and 2, a push-button switch assembly with integral resistance is illustrated connected in circuit with suitable operating circuitry. Electrically, the switch assembly is a voltage divider with selectable and adjustable taps. When the assembly is suitably energized, depression of one push-button selects a tap corresponding to a desired output voltage, having a precise value which is subject to adjustment at the tap. The assembly is suitable for use in an electronically tuned television receiver wherein it provides both channel selection and fine tuning of a selected channel.

The plan view of FIG. 1 illustrates the spacial disposition of the push-buttons 11, tap adjustment means and associated stationary contact surfaces and resistance elements. The side elevation view of FIG. 2, which is taken in a section through a pair of push-button stations, best illustrates the mode of assembly of an individual push-button station.

The push-button switch assembly includes a plurality of cylindrical push-buttons 11 which project upward through a cover assembly 12 and which operate individual switching elements supported beneath. The push-buttons are disposed in two parallel rows with each push-button arranged over a corresponding switch and associated tap adjustment means. The cover assembly 12, which is hinged to a stationary frame, is arranged to support the buttons 11, while the stationary frame supports the operating portions of the individual switches and tap adjustment elements.

The cover assembly 12 is illustrated in FIG. 2, solid lines, in a closed position; and in dotted lines, in the open position. The hinge is shown at 13 attached to hinge support 15, itself attached to the left flange 14 on a channel shaped member 16. The elements 15 and 16 form a part of the stationary frame. The cover assembly is provided with a magnetic latch 17 on the undersurface of the panel remote from the hinge 13, latching the cover assembly against the right flange 14 of the channel 16.

The cover assembly consists of a suitably perforated front panel 18 through which the push-buttons 11 protrude and a cooperating back-up plate 19 also perforated. The back-up plate 19 is spaced from the front panel member 18 by means of a plastic member 20 and attached with suitable fastening means, not specifically illustrated. The perforations in the back-up plate 19 permit the back portions of the push-buttons 11 to protrude through the back-up plate. These two sets of perforations, which are circular permit the push-buttons 11 to slide back and forth loosely in a direction perpendicular to the panel assembly.

Each push-button 11 is retained in the panel assembly by a collar 21 arranged at its mid-section having a diameter larger than the aperture in either the front panel or back-up plate. The collar also provides a shoulder for a compression spring 22 installed between the collar and front panel. When the cover assembly 12 is swung outwardly, the buttons 11 are retained by the collar 21 and the springs 22 which exapnd to force the collars into engagement with the back-up plate. When the cover assembly is in closed position, as illustrated in the lower portion of FIG. 2, pressure of the spring 22 upon the collar 21 holds the under portion of the push-button 11 in engagement with the operating surface of the switch assembly supported beneath on the stationary frame.

The stationary frame supports the operating portions of the individual switches and the tap adjustment elements. The stationary frame comprises the central channel 16, which is of magnetically permeable sheet metal, the hinge support 15, an overlying fine tuning knob support 23, and a pair of adjustable straps 24 attached to the side walls of the channel member 16. The upper surface of the channel member 16 supports an insulating sheet 25 upon which the stationary conductance and resistance elements are supported.

The tuning knob support 23 is a U-shaped channel having its side walls projecting down toward the upper surface of the main channel 16. It is supported in a spaced parallel relationship above the channel 16 by means of a plurality of insulating spacers 26 distributed over the panel 16. The tuning knob support 23 is provided with a plurality of circular perforations, aligned under each of the push-buttons (when the cover assembly is closed) and having a diameter which provides for loose fitting engagement to the individual fine tuning knobs 27. These knobs rest upon the top surface of the support 23 and may be manually rotated. The insulating sheet 25 and panel member 16 are provided with rectangular perforations which lie directly beneath the circular perforations in the tuning knob support. These rectangular perforations, as will be described, engage the lower moving parts of the individual push-button station constraining the motion of these parts to motion along a line perpendicular to the panel and preventing rotation.

The strap 24, which completes the stationary frame members, is attached to the sides of the channel 16 by screws, The straps' mounting holes are elongaTed as shown at 28 so as to permit vertical adjustment of the straps with respect to the bottom of the channel 16. The straps support an electromagnetic winding 29 and an associated core member 30 disposed at a preset distance immedaitely beneath each of the switch elements. The electromagnetic members 29 and 30 aid in holding and clearing the push-buttons.

An individual push-button station may now be considered. A push-button station comprises the operating push-button 11 (which has been earlier described), a rotatable adjustment or fine tuning knob 27, a moving contact assembly 31 and a compression spring 47. The moving contact assembly 31, which is illustrated together with the tuning knob 27 in FIG. 3, comprises a cylindrical operating shaft 32, a slotted contact support 33, a moving contact 34 supported therein, a rectangular lower shaft 35 and a permanent magnet 36.

Two stationary contact surfaces are associated with each of the statins where they are suitably disposed to be connected together by moving contacts 34. As seen in FIG. 1, one pair of stationary contact surfaces 37, 38, is arranged outwardly of each row of the push-buttons, while another pair 39, 40, is disposed inwardly of each row of push-buttons. These contact surfaces are supported upon the insulating sheet 25. The outer contact surfaces 37, 38 are high conductivity conductor runs and are connected together. They provide the ungrounded output connection fo the push-button assembly. The inner contact surfaces 39 and 40 are of resistance material and are serially connected across a source 41 of direct potential. Serial connection is provided by connecting the lower terminal (as seen in FIG. 1) of resistance element 39 to the upper terminal of resistance element 40. The positive terminal of the source 41 is connected to the upper terminal of the resistance element 39 and the negative terminal of the source 41 is grounded. The lower terminal of resistance element 40 is grounded either directly or through an additional resistance, not illustrated.

Thus, as one proceeds from the upper terminal of resistance 39 through resistance 39 to resistance element 40 and then through resistance element 40 to the terminal directly or indirectly grounded, the potential falls continuously through values available from the d.c. source 41. Closure of the contacts of a selected push-button, connecting an outer conductor 37 or 38 to a point on resistance element 39 or 40 produces an output potential on the conductors 37, 38 corresponding to the button depressed.

Furthermore, since the voltage drop in the resistance elements 39 or 40 is continuous, any displacement of the inner-arm of a moving contact corresponding to a push-button along the resistance element 39, 40 will produce a change in voltage at that push-button station.

Rotation of the knobs 27 effects a displacement of the inner arms of moving contacts 34 along the resistance elements 39, 40 and makes available a voltage variation at the corresponding push-buttons. Their construction and operation will now be described in detail.

The tap adjustment knob 27 is of insulating material having an upper cylindrical rim designed to be grasped by the fingers. The rim is cut away to reduce the width of the buttons, to permit a greater degree of adjustment and to permit a greater number of buttons to be arranged in a row of a given length. The knob 27 has a central aperture through which the cylindrical operating shaft 32 of the moving contact assembly may pass freely. The knob 27 is provided with a generlaly cylindrical downward projection 43 which is undercut to engage the undersurfaces of the knob support 23. It is slotted for flexibility to facilitate snap insertion into the perforation on the knob support 23. Alternatively, the downward projection may be tapered conically so as to facilitate insertion. The cylindrical projection is additionally slotted so as to form a double pair of downwardly extending arms which loosely graps the contact support 33 and permit the contact assembly to rise and fall without interference.

The moving contact assembly 31 has its cylindrical operating shaft 32 attached through the slotted contact support 33 to the rectangular lower shaft 35. The connection of the contact support 33 provides frictional alignment of the contact support with the rectangular shaft 35. The permanent magnet 36, which is the lowest element of the assembly 31, is attached to the rectangular shaft 35 by means preventing relative rotation.

When the knob 27 is rotated, the downwardly extending arms on the knob engage the slotted contact support 33 and cause that contact support to rotate about the axis of the assembly. This causes a consequent displacement of the inner arms of contacts 32 along the resistancr elements 39, 40. Thus, adjustment of the knob 27 permits one to obtain a more precise voltage setting for each push-button than one would obtain by merely tapering resistance elements 39 and 40. At the same time, one is permitted to use one button to cover a range of voltage values.

In switching an electronically tuned television tuner, the push-button switch assembly is arranged to provide a preset control potential at each push-button to tune an electronically tuned television receiver to a corresponding pre-arranged channel. The dotted block 42, which designates a representative voltage sensitive tuning circuit, such as one might find in a television receiver, comprises an inductor 57, a d.c. isolating capacitor 44, connected in series with the inductor 57, and a voltage tunable capacitor 45 connected in shunt with the series circuit formed by the elements 57 and 44. The element 45 is capacitive in nature, having a value which is controlled by the applied voltage. It may take several conventional forms, including that of a reversely biased diode. The capacity of the element 45 resonates with the inductor 57 to establish the resonant frequency of tuned circuit 42. The resonant circuit 42 has one terminal grounded and the other terminal connected through an r.f. isolating resistance 46 to the conductors 37 and 38 of the push-button switch assembly. Since the tuned circuit presents a high impedance at the point of connection, the isolating resistance can assume a value of typically 50,000 ohms.

The available voltages from the push-button assembly and the tuning characteristic of the voltage tuning capaictor 45 are selected to cause the resonant circuit 42 to assume the desired frequencies required for the selection of specific television channels in the locality in which the television is to be operated. Normally, the frequencies will include both VHF and UHF channels. Since the receiver is designed to be used primarily in one location, the tuning knobs 27 will normally be maintained concealed behind the front panel assembly 12. If, however, one desires to improve the tuning of a particular channel or to retune a button to another channel, then the panel assembly 12 may be rotated forward to expose the tuning knobs and permit the desired push-buttons to be adjusted.

In the application to a television receiver, each individual push-button station is designed to provide access to each VHF channel and to one of five UHF channels with adjacent push-button stations overlapping one channel. To achieve this objective, the moving contact of each adjustment knob is arranged to be displaced over five units of length along the resistance material 39, 40, with the adjacent contacts each overlapping on unit of length. In the event that future local stations allocations prevent use of this arrangement, then greater overlap or a greater number of push-buttons may be necessary.

The resistance material for the stationary contacts 39, 40 is a conventional resistance sheet of the type used in potentiometer construction and is bonded to the layer 25. The resistance elements are preferably cut with a width taper which corresponds to the voltage tuning characteristic of the tuning element 45 being employed. Preferably, the resistance elements are supported in a common thermal environment so as to maintain mutually consistent settings against varying ambient conditions.

Let us now return to the operation of an individual push-button switch. During operation, the push-buttons 11 are arranged to move in an axis perpendicular to the plane of the panel assembly 12 where the undersurface of the button 11 engages the upper surface of the cylindrical operating shaft 32 of the moving contact assembly 31. The spring 22 presses the button 11 into engagement with the operating shaft. The adjustment knob 27 is centrally apertured and the operating shaft 32 of the contact assembly 31 passes through this aperture where it is accessible to the undersurface of the push-buttons 11. This allows surface contact engagement between the push-button and the operating shaft 32 which permits one to separate the push-buttons from the underlying switches and adjustments when it is desired to adjust the knobs 27. In addition, this mode of surface contact engagement allows the moving contact assembly 31 to rotate (about an axis perpendicular to the panel assembly) or to be displaced laterally by small amounts without interfering with push-button operation of the contacts.

When the push-buttons 11 are in an undepressed position, the moving contact assembly 31 has its contacts 34 spaced above and out of contact with the corresponding contact surfaces on the stationary contacts 37–40. At the same time the magnetic member 36, which is attached to the moving contact assembly 31, is in direct contact with the undersurface of the channel member 16. This undersurface is the stop for upward motion of the push-button. The push-button remains in this up position under the primary influence of the magnetic member 36, which being a permanent magnet is attracted to the undersurface of the permeable frame member 16. To a lesser degree, the compression spring 47 compressed between the contact support 33 and the insulating surface 25) holds the moving contact assembly 31 in an up or undepressed position.

When a push-button is depressed as illustrated in the righthand portion of FIG. 2, the moving contacts 34 move into contact with the stationary contact surfaces and electrically connect them together. In a depressed position, the magnetic member 36 comes into direct contact with the upper surface of the electromagnetic core member 30. Such contact is adjusted to occur when the moving switch contacts 34 are resiliently biased into contact with the stationary contacts 37–40. In the depressed position, the moving contacts 34 and the compression spring 47 are in a compressed condition. Thus, the core member 30 becomes the stop for downward motion of the push-buttons and, as will be explained below, means for holding the button in a down position. The position of this stop is adjustable within limits permitted by slotted openings 28 in core supporting straps 24.

As indicated above, the permanent magnet members 36, in addition to engaging the up and down stopping surfaces for limiting travel of the moving contact assembly 31, assist in holding these assemblies in their proper up and down positions. The permanent magnetic member 36 is provided with sufficient magnetic attraction to the upper surface of core member 30 to sustain the assembly 31 in the "down" position against the resilient forces of the compression springs 47 and the contact arms 34, in addition to any unsupported weight in the moving parts of that assembly.

In the "up" position, where the member 36 is engaged with the undersurface of panel 16, there is a smaller requirement for magnetic force. In the up position, resilient bias from 47 is aiding. The magnetic force and aiding resilient force should exceed any unsupported weight in the individual button.

While several configurations and magnetizations of the permanent magent member 36 may be employed, a convenient configuration is a slotted cylindrical arrangement (illustrated) wherein the magnetic poles are rranged in diametrically opposite positions perpendicular to the axis of the cylinder. The internal magnetization is normally U-shaped with the stronger fields on the slotted undersurface. The member 36 is then oriented with the poles arranged directly over the exposed edges of the magnetic core 30. This places the strongest lateral magnetic field just above the core pieces 30, and provides a positive latching to the button in the down position.

While the permanent magnets 36 participate with the members 16 and 30 in holding individual buttons in the up and down positions, they also participate in the self-clearing operation which prevents more than on button from being down at the same time.

Self-clearing is provided by means of the electromagnetic coil 29 and core 30 arranged beneath the individual permanent magnets 36 and the external reset circuit 48 electrically connected to the electromagnetic coil. The coil 29 has a relatively large area central opening and the winding cross section is compacted into a small bundle which is fitted into the U-shaped core member 30 whose width approximates the diameter of a magnet 36. The field configuration about the winding 29 in the immediate vicinity of the magnetic members 36 is roughly circular. Viewed macroscopically the close-in field is approximately toroidal. Because of its intimacy with the core 30, the winding 29 is closely coupled thereto. When the current flows in the coil, poles of opposing polarity are induced in the upper edges of the U, with the local field concentrated at and generally directed across the gap. The induced poles are spaced a distance aprpoximately equal to the spacing between the poles of the magnets 36. When the clearing current flows, therefore, the outer and inner edges of the core assume mutually opposite polarities, which polarities are also the same as those of the permanent magnets 36 aligned immediately opposite. Thereupon, any permanent magnets in a down position are repelled, forcing the contact assemblies 31 up, and clearing the corresponding buttons.

The clearing circuit 48 illustrated in FIG. 2 is arranged to sense the momentary depression of a given push-button and to thereupon create a repulsive force raising all the push-buttons to an up position except the one being momentarily depressed. The clearing circuit comprises a pair of complementary transistors 49, 50, diodes 51 and 52, resistances 53, 54, capacitor 55 and a bias source 36. Both sensing the depression of the push-button and force for clearing the nondepressed push-buttons is achieved by means of the single coil winding 29.

The clearing circuit 48 is connected as follows: The winding 29 has one terminal connected to the emitter of transistor 49. The base of the transistor 49 is connected through the diode 51, poled in the same direction as the input junction of the transistor 49, to the other terminal of the winding 29. A resistance 53 shunts the diode 51. The collector of the transistor 49 is connected through a load resistance 54 to a point of ground potential. The collector of transistor 49 is also connected through a coupling capacitor 55 to the base of complementary transistor 50. The emitter of transistor 50 is grounded. The input junction of the transistor 50 is shunted by an oppositely poled voltage stabilizing diode 52. The collector of the transistor 50 is connected to the base of the transistor 49. Suitable operating potentials are provided by a d.c. source 56 connected between ground and the base connected terminal of the winding 29.

The clearing circuit 48 is normally quiescent but produces a large clearing pulse when a push-button is depressed. The foregoing pair of collector to base interconnections between the transistors provides regenerative feedback and tends to force both transistors into the same state of conduction. The quiescent condition of the circuit is one in which both transistors are nonconductive, the capacitor 55 isolating the input junction of the transistor 50 from forward biasing potentials. Similarly, the low d.c. impedance path across the input junction of the transistor 49 tends to reduce the input junction potential below conduction.

Upon depression of a push-button the reset circuit begins to function in an active manner. As the push-button is depressed, the permanent magnet 36 is thrust suddenly into contact with the core member 30 and its associated coil 29. This motion induces a short unidirectional pulse applied in conduction inducing polarity across the input junction of the transistor 49 through the circuit including the diode 51 and resistance 53. As the transistor 49 begins to conduct, capacitor 55 couples a conduction inducing pulse to the base of transistor 50. Thus, after the button is depressed, current begins to flow in both transistors under the influence of their regenerative interconnection and both are driven toward saturation.

As the transistors begin to conduct, the current path through the inductor 29 is closed through the transistors and the voltage across the inductor is stepped from a near zero quiescent value to a maximum value, poled oppositely to the initial pulse. This voltage causes a current flow in the inductor which is now the reverse of that created by the original pulse, and it exerts an opposing force on all of the electromagnetic cores 36, including the one depressed. The field configuration about the winding 29 in the immediate vicinity of the magnetic members 36 is circular with the outer edge of the core member 30 assuming an N polarity with the inner edge assuming an S polarity. Since these electromagnetically induced polarities are the same as the polarities of the permanent magnets 36, the latter are repelled.

The force of repulsion produced by the energized electromagnetic core and coil is set to exceed the weight of the moving mass of each button and to overcome whatever stray friction may be expected to be encountered. The force is set to achieve positive clearing action irrespective of panel orientation. The repulsive force (and available energy) is set such that clearing does not interfere with closing the desired button with a light finger pressure.

Continuing now with the operation of the clearing circuit 48, transistors 49 and 50 are connected to provide positive feedback and the capacitor 55 is an element of the positive feedback path such that "one shot" operation is achieved. Under quiescent conditions the emitter base junctions of the complementary transistors 49 and 50 are back biased (or zero biased) and the entire voltage of the power supply 56 exists across the collector-base junctions drawing no current and providing no voltage drop across the series connected element 29 which is the winding generating the repulsive magnetic force. When triggered, the PNP-NPN switch 49–50 becomes a short circuit and the entire power supply voltage 56 is impressed across winding 29. As this inductive winding builds up current with time $[I=1/L \int v\,dt]$, the capacitor 55 builds up voltage with time $[V=(1/C) \int i\,dt]$ and more of the power supply voltage exists across the PNP-NPN switch and less exists across the inductor. A maximum current exists when all the power supply voltage is impressed across the switch and none exists across the inductive winding 29. The voltage across capacitor 55 continues to rise as the inductive winding 29 reverses polarity until the current flows through the emitter base junction of transistor 49 and diode 51 and winding 29 exclusively.

At the instant the voltage at the collector of transistor 49 ceases to rise, current flow through capacitor 55 and into the base of transistor 50 is halted. At this point in time two independent events occur. The "flyback" current in winding 29 decreases to zero (essentially linearly) with its voltage clamped by the series conduction of diode 51 and transistor 49 operating as an emitter-base diode; and the voltage across capacitor 55 is discharged by resistor 54 with the discharge path completed through a now forward biased diode 52. When both the relaxation of the current in the inductive winding 29 and the discharge of voltage in the capacitor 55 has been completed, the circuit is once again in the quiescent condition and ready to be retriggered.

The duration of the period of repulsion is preferably a few tenths of a second so that the push-button clearing action exerts only a momentary resistance to depression of the push-button, preferably unsensed by the operator's finger. The period of repulsion is normally less than the period that an operator is likely to sustain his finger pressure and of a magnitude comparable to that required to overcome the normal momentum of the button and moving contact assembly which exists near the bottom of the stroke. As the stroke proceeds, there will be a sensible lightening of finger pressure as the magnet 36 reduces the air gap with the lower stop and pulls the contact assembly 31 home. During clearing, an audible click is caused as the button previously depressed is raised. The contact assembly 31 reaches home relatively silently and without vibration at a speed further reduced by the energy required to compress the spring 47 and flexible contactor 34.

In general, the foregoing operation provides a desired subjective reaction that users would like to associate with push-button switches. During the initial portion of the push, there will be an initial resistance that the user will sense as the button pushes the contact assembly away from the upper stop. Where the holding force is mostly magnetic, the force is initially quite large and falls off rapidly. Where the holding force is partly resilient and partly magnetic, as indicated in the preferred embodiemnt, the initial finger sensation is one of more nearly steady pressure. Then, as the button nears completion of the stroke, there will be a sensation of slightly decreasing pressure as the magnetic force increases rapidly.

Normally it is preferred that the clearing pulse occur towards the lower limit of button travel since at this point the button and contact assembly are acquiring most of their downward momentum and will not be fully halted if the rather substantial clearing force desired to insure positive clearing operation is exerted. In this preferred mode of operation, the finger will not sense an impact that it might have experienced had the clearing pulse occurred at the beginning of the stroke. Instead, the clearing pulse is masked and the finger senses only a perceptible lightening of pressure as the button hurries home. While the factors so far discussed are largely subjective, they appear to lead to the user attractiveness of the present push-button assembly.

Electronically sensing the motion of the magnets and then generating a clearing pulse tends to insure proper timing and reduces the chance for premature clearing. The pulse induced in the coil 29 from the motion of the magnet 36 tends to peak near the bottom of the push-button stroke due to the effect of the closing air gap between the magnet 36 and the core 30 associated with the coil 29. Thus, there is a natural delay in this configuration of at least three-fourth of a period for the full stroke.

The induced pulse is then used to turn on the clearing circuit 48. The clearing circuit 48 has a threshold which is set above the level that one would expect to encounter from noise alone and just below the lowest peak that one would expect the induced pulse to reach in normal operation. Attaining the peak of the clearing pulse after sensing takes approximately 50 milliseconds in a typical configuration. Assuming the normal period for a stroke of from 0.1 to 0.2 of a second, the clearing pulse will not peak until near the bottom of the push-button stroke. Typically, the current peak will occur momentarily after actual contact of the magnet 36 with the core 30. The clearing pulse will tend to decay from its peak value for a longer period, typically another 150 milliseconds. Thus, if one would sense the magnetization of the core 30, a repulsive field would be encountered throughout the approximately 200 milliseconds duration of magnetizing current in the coil 29. However, the magnetizing influence of the magnetic member 36 as it approaches the edges of the core 30 opposes the induced field from the coil. After contact, the magnetomotive force of the magnet exerted upon the domains of the upper elements of the core becomes large and the magnet will stick so long as it exceeds the opposing field created in the same domains by current in the coil. Assuming contact between the magnet and the core, there is only a brief period of perhaps 60 or 70 milliseconds about the current peak that the field from the coil will exceed that from the stationary contacting magnet and thus tend to repel a stationary magnet.

This brief period of repulsion, however, does not determine whether clearing will occur when one is considering the dynamic situation. When the push-button is moving down, the electrical energy available to kick the button and contact assembly into an upper position is reduced by whatever kinetic energy may be expended in bringing the button and contact assembly to a stop. Thus, if the timing of the clearing pulse occurs at a time when the button being depressed is moving downward with maximum velocity, it will take appreciably more electrical energy to clear that button than if it had been stationary. In the dynamic situation, the upward departure of the button will be delayed until energy has been supplied from the pulse to offset this kinetic energy. In practice, the available energy in the clearing pulse is set to be adequate to clear any stationary buttons, but inadequate to clear a button which is moving downward with appreciable velocity. Ideally, therefore, the clearing pulse occurs near the time of maximum downward kinetic energy of the push-button and toward the end of the push-button stroke for maximum absorption of the electrical energy by the available kinetic energy. With this adjustment, the button being depressed will stay depressed even with negligible continuing finger pressure. At the same time, finger sensation of the clearing pulse will be minimum and readily masked.

As previously indicated, the magnetic member 36 contacts the undersurface of the permeable panel 16 in the up position and the edges of the core member 30 in the down position. Thus, in the illustrative embodiment, the magnet itself comes in contact with the stops. In addition, since these surfaces are permeable, the magnetic attraction toward them serves to hold the contact assembly in the up or the down position.

In the up position, in the illustrative embodiment, the magnet 36 stops against the undersurface of the permeable channel 16. Thus, in the up position the magnet attracts the button upwardly. At the same time, the cylindrical spring 47 provides an additional upward force. One may achieve the stopping and holding functions by eliminating the spring 47 and insuring that the magnetic force on 36 is adequate to hold the button in the up position. Similarly, one may utilize a magnet which has little or no attractive force on the upper surface and resort exclusively to the biasing force of the spring 47 to hold the button up.

The clearing circuit 48 which has been illustrated in FIG. 2, is one of a large number that may be used with equal facility. Its principal advantage is in its simplicity and its lack of need for a sensing winding separate from the clearing winding. One can, of course employ other circuits which operate with a single winding combining these two functions. As earlier implied, separate sensing and clearing windings may be employed. In either case, the general requirement of the illustrated clearing circuit 48 is to respond to the changing field caused by the downward motion of a magnetic member 36 and in response to that sensing to generate a repulsive field in the core pieces 30 adequate to clear the stationary depressed buttons.

The button depression sensing function can be performed in a number of alternate ways. One such way is by momentary electrical contact made as individual buttons are in downward passage. In that event, a mechanical motion sensor closes an electrical switch and momentarily energizes the clearing coil. This provision would eliminate the need for an electromagnetic sensing coil.

It is desirable to have the output voltages required by the tuner for reception of assigned frequencies conveniently spaced. The push-buttons themselves should be evenly spaced along the resistance element for convenience and appearance and they should permit continuous coverage of all allocated frequencies within the band. Normally, this dictates that the resistance element 20 be tapered by a width adjustment.

The exact taper required takes into account both the voltage frequency characteristic of the tuner and the normal crowding at the higher frequency end of the band when fixed bandwidths are to be maintained. In the case of the AM radio application, the taper should be made so as to prevent crowding of the stations at the higher frequency end of the band.

In the case of the TV application, there are several considerations. The problem of high frequency crowding in the television application is similar to that in the AM application. Another problem is the matter of accomodating a large number of UHF channels in relation to the smaller number of VHF channels. This is normally done by giving a UHF push-button a five channel capability whereas a VHF push-button is given a one channel capability.

A third problem in the TCV application are the gaps between channels 4 and 5 and channels 6 and 7 in the VHF band. The 4 megacycle gap between channels 4 and 5 may be made up by introducing a loop in the resistive element outside the area used for contact adjustment. The gap between channels 6 and 7 may be solved by effectively band switching the tuner between the low VHF and the high VHF channels. Normally, this entails the use of a separate segment of the resistance element, separately connected across source 41.

The usable capacitance range of the varactor diode will not usually span all the VHF channels. Therefore, the low VHF channels are normally separated from the high VHF channels. This may be done by separating the resistance elements. Since the segment of the resistance element associated with the low VHF buttons must supply the corresponding range of tuning voltage, that resistance element will normally be connected across the source 41, in parallel with other segments in the resistance element providing the high VHF channels, and the UHF channels. The present actual assignment of UHF channels is compatible with tuning the UHF range with a single segment of the resistance element.

Due to the desirability of accomodating wider tuning ranges, two types of varactor diodes are now in use. These strongly influence the voltage frequency characteristic of the tuner. In the application to AM broadcast band reception, where it is desirable to span the 3 to 1 range of frequencies, a hyper-abrupt varactor diode is now available. TV applications usually restrict one to the normal varactor diode, which is less lossy at these frequencies. Since the television channels span a large frequency range, band switching as discussed above will usually be required. This may be done by using separate segments of the resistance element as described and by introducing other inductors and/or varactors into the resonant circuit by d.c. switching of suitably biased diodes. A convenient way of generating this bias is to maintain separate conductive buses, one for each band, which, upon energization, activate the associated diodes and make the varactor connection.

The principal embodiment has been shown having a hinged cover with push-buttons mounted therein. The cover may then be rotated away from a stationary assembly of switching and variable resistance elements at each push-button station. One may, of course use mechanisms other than a hinge to make the cover removable. One can, for instance, snap the cover in place, so that it may be removed directly by hand. If this mode of removal is employed, the elements 32 of the contact assemblies 31 may become the actuating push-buttons themselves. In this event, they may be lengthened to protrude through the demountable panel for external actuation by the operator. If concealment of the adjusting knobs is unnecessary, one may eliminate the cover, allowing the elements 32 to extend outwardly of the encircling knobs 27.

What is claimed as new and desired to be secured by Letters Patent of the United States is:

1. In combination:

a. a stationary planar resistance elment for providing a single spacially extending current path exhibiting a continuous voltage drop when energized, b. a collector element arranged parallel to said resistance element, c. a plurality of tap switches arranged adjacent said resistance element and distributed in succession along said single current path at regions of successively diminished voltages, each tap switch having a moving contact rotationally displacable in a plane parallel to the plane of said resistance and said collector to a predetermined position along said path for selecting a predetermined resistance value and displaceable in a direction perpendicular to said resistance path for making and breaking contact with said resistance element, and d. clearing means for opening previously closed contacts in other tap switches when the contacts of one tap switch are closed.

2. The combination set forth in claim 1 wherein each of said tap switches has:

a. a push-button, and b. means for coupling push-button motion along a direction perpendicular to said resistance plane to said moving contact.

3. The combination set forth in claim 1 wherein each of said tap switches has:

a. a push-button, and b. means for coupling push-button motion along a direction perpendicular to said resistance plane to said moving contact but allowing motion between said members in a plane parallel to said resistance plane.

4. The combination set forth in claim 1 wherein each of said tap switches has a. a rotatable knob, and b. means for coupling knob rotation about an axis perpendicular to said resistance plane to said moving contact.

5. The combination set forth in claim 1 wherein each of said tap switches has:

a. a rotatable knob, and b. means for coupling knob rotation about an axis perpendicular to said resistance plane to said moving contact, but allowing motion between said members along a direction perpendicular to said resistance plane.

6. The combination set forth in claim 1 wherein each of said tap switches has:

a. a push-button, b. means for coupling push-button motion along a direction perpendicular to said resistance plane to said moving contact member, but allowing motion between said members in a plane parallel to said resistance plane, c. a rotatable knob, and d. means for coupling knob rotation about an axis perpendicular to said resistance plane to said moving contact, but allowing motion between said members along a direction perpendicular to said resistance plane.

7. The combination set forth in claim 6 wherein said tap switch is provided with a moving contact assembly, displaceable by said push-button in a direction perpendicular to said resistance plane from an undepressed to a depressed position, said positions corresponding respectively to non-contact and contact with said resistance element, said moveable contact being supported upon said assembly in engagement with said knob by means permitting rotation relative to said contact assembly about an axis perpendicular to said resistance plane.

8. The cobination set forth in claim 7 wherein said knobs are supported for rotation upon a first stationary member disposed in front of said moving contact assembly, each of said knobs having a backward projection for rotating said contacts with respect to said assembly, means affixed to said first stationary member for slidably supporting said moving contact assembly, said slidable support allowing motion of said assembly in a direction perpendicular to said resistance plane but preventing rotation about an axis perpendicular to said resistance plane.

9. The combination set forth in claim 8 wherein each of said knobs is centrally perforated to permit mechanical coupling through said knob between said push-buttons and said moving contact assemblies.

10. The combination as set forth in claim 9 wherein a cover is provided removably attached to said stationary member for supporting each of said push-buttons in position in front of each of said tap switches when said cover is in place and which upon removal permits access to said knobs.

* * * * *